(12) United States Patent
Eshun et al.

(10) Patent No.: US 8,227,849 B2
(45) Date of Patent: Jul. 24, 2012

(54) METHOD AND STRUCTURE FOR CREATION OF A METAL INSULATOR METAL CAPACITOR

(75) Inventors: Ebenezer E Eshun, Newburgh, NY (US); Ronald J Bolam, East Fairfield, VT (US); Douglas D Coolbaugh, Highland, NY (US); Keith E Downes, Stowe, VT (US); Natalie B Feilchenfeld, Jericho, VT (US); Zhong-Xiang He, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 58 days.

(21) Appl. No.: 12/706,834

(22) Filed: Feb. 17, 2010

(65) Prior Publication Data

US 2010/0149723 A1 Jun. 17, 2010

Related U.S. Application Data

(62) Division of application No. 11/382,544, filed on May 10, 2006, now Pat. No. 7,728,372.

(51) Int. Cl.
*H01L 29/92* (2006.01)

(52) U.S. Cl. ............... 257/306; 257/E29.343

(58) Field of Classification Search .............. 257/306, 257/310, E29.343
See application file for complete search history.

(56) References Cited

U.S. PATENT DOCUMENTS

| | | | |
|---|---|---|---|
| 5,406,447 A | 4/1995 | Miyazaki | |
| 6,274,435 B1 | 8/2001 | Chen | |
| 6,319,767 B1 | 11/2001 | Cha et al. | |
| 6,642,100 B2 | 11/2003 | Yang et al. | |
| 6,730,573 B1 | 5/2004 | Ng et al. | |
| 6,830,971 B2 | 12/2004 | Balakumar et al. | |
| 6,878,616 B1 * | 4/2005 | Casey et al. | 438/623 |
| 6,881,999 B2 * | 4/2005 | Lee et al. | 257/306 |
| 6,992,338 B1 * | 1/2006 | Yin et al. | 257/197 |
| 7,205,634 B2 * | 4/2007 | Liao et al. | 257/532 |
| 7,294,544 B1 * | 11/2007 | Ho et al. | 438/250 |
| 7,402,486 B2 * | 7/2008 | Kang | 438/238 |
| 2001/0010955 A1 * | 8/2001 | Chen | 438/239 |
| 2002/0006674 A1 | 1/2002 | Ma et al. | |
| 2002/0197815 A1 | 12/2002 | Yoshitomi | |
| 2003/0203586 A1 | 10/2003 | Volant et al. | |
| 2003/0211731 A1 | 11/2003 | Kai et al. | |
| 2004/0104420 A1 | 6/2004 | Coolbaugh et al. | |
| 2004/0180508 A1 | 9/2004 | Park | |
| 2005/0032301 A1 | 2/2005 | Udayakumar et al. | |
| 2006/0214265 A1 | 9/2006 | Goebel et al. | |

FOREIGN PATENT DOCUMENTS

| | | |
|---|---|---|
| EP | 0749167 A1 | 12/1996 |
| EP | 0920061 A | 6/1999 |
| JP | 0 749 167 | 12/1996 |
| JP | 0 920 061 | 6/1999 |

OTHER PUBLICATIONS

International Search Report dated Apr. 7, 2007.

* cited by examiner

*Primary Examiner* — Wensing Kuo

(74) *Attorney, Agent, or Firm* — Katherine S. Brown

(57) ABSTRACT

The invention is directed to an improved capacitor that reduces edge defects and prevents yield failures. A first embodiment of the invention comprises a protective layer adjacent an interface of a conductive layer with the insulator, while the second embodiment of the invention comprises a protective layer on an insulator which is on a conductive layer.

10 Claims, 3 Drawing Sheets

US 8,227,849 B2

METHOD AND STRUCTURE FOR CREATION OF A METAL INSULATOR METAL CAPACITOR

CROSS-REFERENCE TO RELATED APPLICATION

The present application is a divisional application of U.S. patent application Ser. No. 11/382,544, filed May 10, 2006 and entitled "Method and Structure for Creation of a Metal Insulator Metal Capacitor".

BACKGROUND OF THE INVENTION

1. Field of the Invention

The invention relates generally to semiconductor devices, and more particularly to a novel Metal Insulator Metal (MIM) capacitor and method for creation of the same.

2. Description of the Related Art

Metal Insulator Metal (MIM) capacitors are important because chip miniaturization requires integration of multiple passive components. Capacitors are just one such passive device. Advantages of a MIM capacitor include decreased footprint, higher quality factor, and lower parasitics. A MIM capacitor comprises an insulator, which separates two metal layers. One disadvantage associated with prior art MIM capacitors are edge defects that occur in the insulator at the interface with the top metal layer.

FIG. 1 depicts a prior art MIM capacitor 100 which is prone to edge defects. Edge defects result in early device failure. Therefore, to improve yield it is desirable to eliminate edge defects or weak dielectric at the periphery of the top electrode from the top electrode etching in a MIM capacitor. An insulator 104 separates two conductive layers 102. Edge defects 110 occur in the insulator 104 at the interface of the insulator 104 with the top conductive layer 102. In an effort to obviate edge defects, a pullback chemistry was developed. Such pullback chemistry results in a MIM capacitor with an insulator 104 that is thicker at the interface with the top conductive layer 102. FIG. 2 depicts a prior art MIM capacitor with pullback.

FIG. 2 depicts a prior art MIM capacitor with pullback 200. The pullback chemistry results in a MIM capacitor 200 with a top conductive layer 102 that is pulled back 220 at the interface of the conductive layer 102 with the insulator 104. The insulator 104 is thicker 230 at the interface with the top conductive layer 102. The thickened insulator 104 reduces edge defects and also reduces leakage. Leakage reduction improves yield. One disadvantage of a MIM capacitor with pullback 200, however is that such construction only works with an insulator 104 comprised of low-K dielectric, e.g. SiN. Such construction, however, does not work with an insulator 104 comprised of high-K dielectric. As one skilled in the art would recognize, high-K dielectric includes, but is not limited to the following materials: $Ta_2O_5$, $Al_2O_3$, and $HfO_2$.

FIG. 3 depicts a prior art MIM capacitor with pullback with an insulator comprised of high-K dielectric 300. The insulator 104' comprises high-K dielectric. The pullback chemistry results in not only a MIM capacitor with a top conductive layer 102 that is pulled back 220 at the interface of the conductive layer 102 with the insulator 104, but also a MIM capacitor with a thin insulator 104' at the interface. Such insulator 104 results in edge defects and increased leakage.

What is needed in the art is an improved MIM capacitor that reduces edge defects and maintains high yield for all dielectrics.

BRIEF SUMMARY OF THE INVENTION

The invention is directed to a capacitor structure and method for creation of the same.

A first embodiment is directed to a capacitor, comprising a conductive layer, an insulator, a conductive layer, and a protective layer. The insulator is on a conductive layer, while a conductive layer is on the insulator. The conductive layer on the insulator has a length that is shorter than the length of the insulator at the interface of the insulator with the conductive layer. The protective layer is adjacent the interface of the insulator with the bottom conductive layer.

A second embodiment is directed to a capacitor comprising a conductive layer, an insulator, a protective layer, and a conductive layer. The insulator is on the conductive layer. The protective layer is on the insulator. A conductive layer is on the protective layer and has a length shorter than the length of the insulator at an interface of the insulator with the protective layer.

The invention solves the aforementioned problems associated with prior art capacitors. More specifically, the invention prevents yield failures associated with high-K dielectric through the use of a protective layer. The invention is dielectric independent. Therefore, both high and low-K dielectric materials can be used as insulator without negatively affecting yield.

For at least the foregoing reasons, the invention improves capacitor technology.

BRIEF DESCRIPTION OF THE DRAWINGS

The features and the element characteristics of the invention are set forth with particularity in the appended claims. The figures are for illustrative purposes only and are not drawn to scale. Furthermore, like numbers represent like features in the drawings. The invention itself, however, both as to organization and method of operation, may best be understood by reference to the detailed description which follows, taken in conjunction with the accompanying figures, in which:

DETAILED DESCRIPTION OF THE INVENTION

The invention will now be described with reference to the accompanying figures. In the figures, various aspects of the structures have been depicted and schematically represented in a simplified manner to more clearly describe and illustrate the invention.

By way of overview and introduction, the embodiments of the invention are directed to a capacitor and method for creation of the same. All embodiments comprise a protective layer deposited either adjacent an insulator upon which the second conductive layer is deposited or on an insulator upon which the second conductive layer is deposited. In all embodiments, the length of the top conductive layer is shorter than the length of the insulator 104 at the interface with the second conductive layer 102 (first embodiment) or protective layer 540 (second embodiment).

A first embodiment of the invention will be described with reference to the FIGS. 4A-C, which depict the formation of an improved capacitor, and more specifically an improved Metal Insulator Metal (MIM) capacitor. The first embodiment of the invention comprises depositing a protective layer 440 adjacent an insulator 104. The protective layer 440 prevents the insulator 104 from being removed during the pull back process. The protective layer 440 therefore maintains a thick insulator below the top conductive layer 102. In the first embodiment, the insulator 104 is deposited on conductive layer 102, which can be referred to as the bottom conductive layer 102. The first embodiment is described more specifically herein below.

Figure 1:
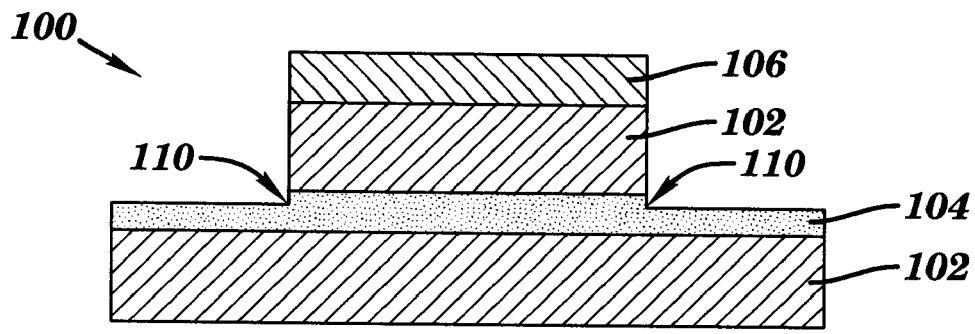
FIG. 1 depicts a prior art MIM capacitor with edge defects 100.
Figure 2:
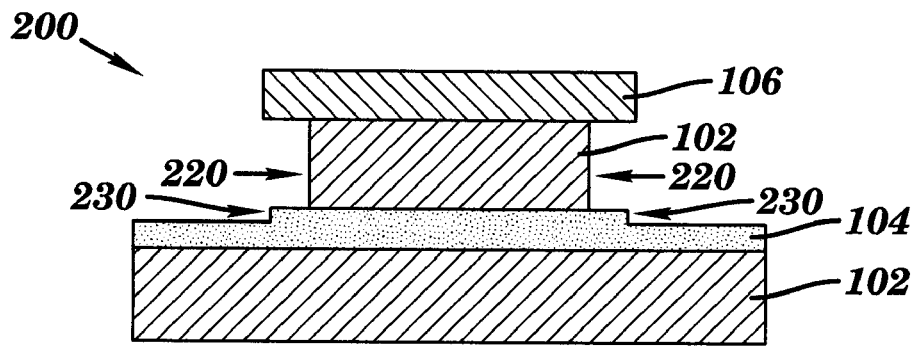
FIG. 2 depicts a prior art MIM capacitor with pullback 200.
Figure 3:
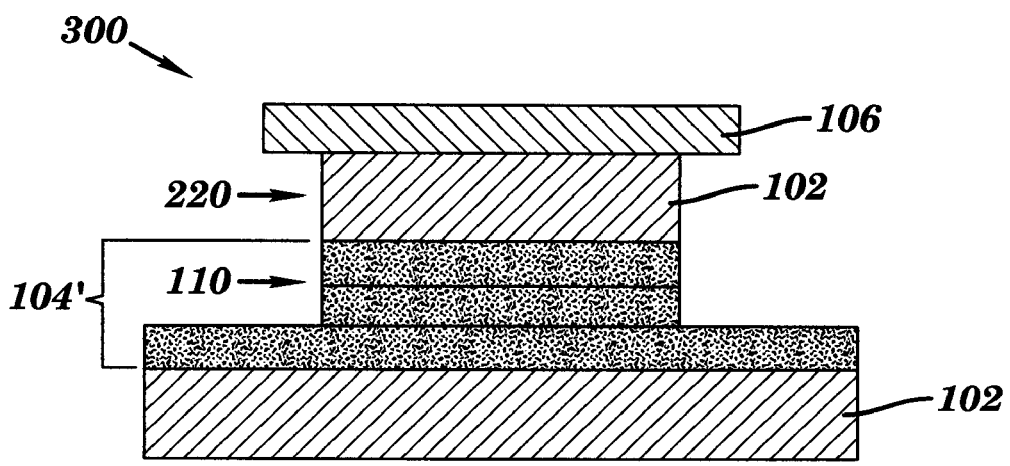
FIG. 3 depicts a prior art MIM capacitor with an insulator comprised of high-K dielectric 300.
Figure 4A:
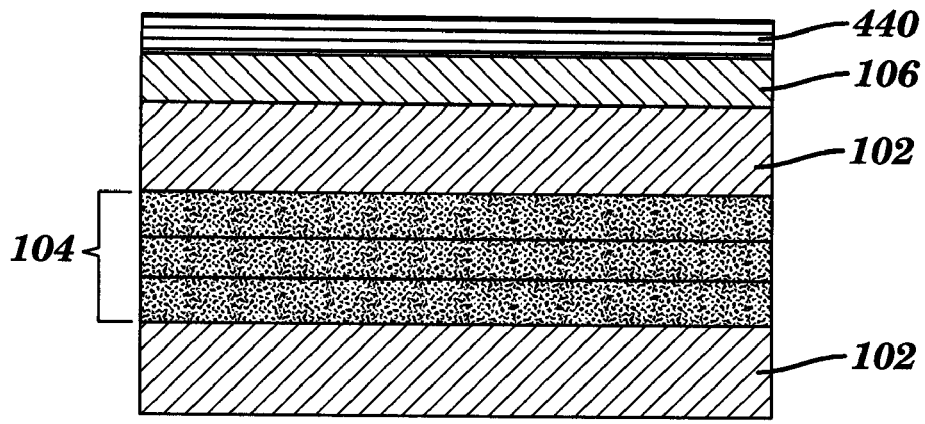
FIG. 4A depicts the material stack that comprises a first embodiment of the invention.

FIG. 4A depicts the material stack that comprises a first embodiment of the invention. As depicted, the material stack comprises two conductive layers 102 separated by an insulator 104. An optional, although not required, feature of the first embodiment includes a protective film 440 deposited on the etch stop 106. Conductive layer 102 may comprise TiN, Ta, TaN, W, Al, Cu or any combination thereof, while insulator 104 may comprise $Al_2O_3$, SiN, $HfO_2$, $ZrO_2$, $SiO_xN_y$, $HfSiO_x$, $SiO_2$, $SrTiO_3$, $La_2O_3$, $Y_2O_3$ or any combination thereof. Insulator 104 is preferably SiN or any other non-oxide dielectric that withstands $CF_4$ plasma etch, which is the process most commonly employed for pullback.

Figure 4B:
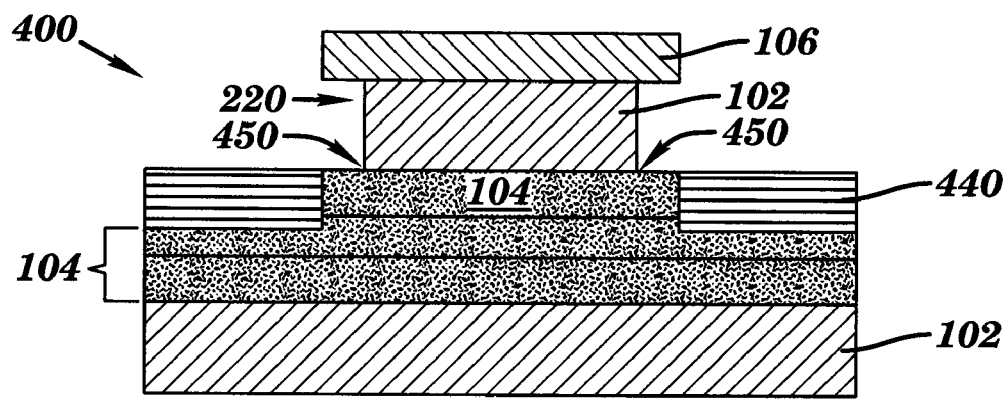
FIG. 4B depicts the first embodiment of the invention 400.

FIG. 4B depicts the first embodiment of the invention 400. The first embodiment of the invention 400 comprises a MIM capacitor with a protective layer 440 that fills in a vacancy created by a partially removed insulator 104. As depicted, the insulator 104 comprises multiple layers, however, as one skilled in the art would recognize, the insulator 104 is not limited to multiple layers, and may comprise a single or dual layer. Pullback chemistry operated on the first embodiment of the invention 400, which, as described herein above, results in a MIM capacitor with a conductive layer 102 that is pulled back 220 at the interface of the conductive layer 102 with the insulator 104. The pullback chemistry also negatively affected the insulator 104, however, which is evident because the insulator 104 has been partially removed. In order to prevent yield failures due to the partially removed insulator 104, a protective layer 440 is deposited on the insulator 104 adjacent the interface with the conductive layer 102.

Figure 4C:
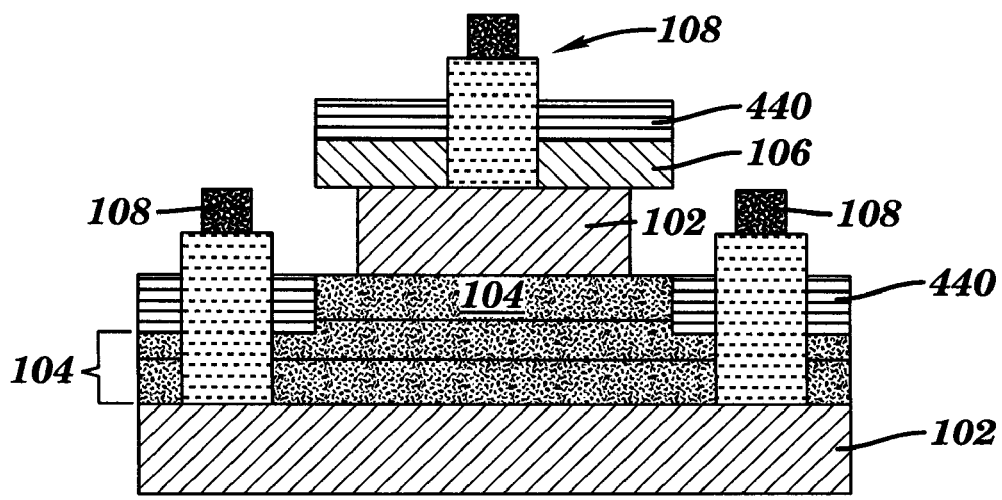
FIG. 4C depicts the first embodiment of the invention 400 with additional, optional features.

FIG. 4C depicts the first embodiment of the invention 400 with additional, optional features. As depicted, contacts 108 have been added to the first embodiment, as well as another protective layer 440, which is a byproduct of forming the first protective layer 440 on insulator 104.

A second embodiment of the invention will be described with reference to the FIGS. 5A-C, which depict a further improved MIM capacitor. The second embodiment of the invention comprises depositing a protective layer 540 on top of an insulator 104. In both the first and second embodiments, the insulator 104 is deposited on conductive layer 102. The second embodiment is described more specifically herein below.

Figure 5A:
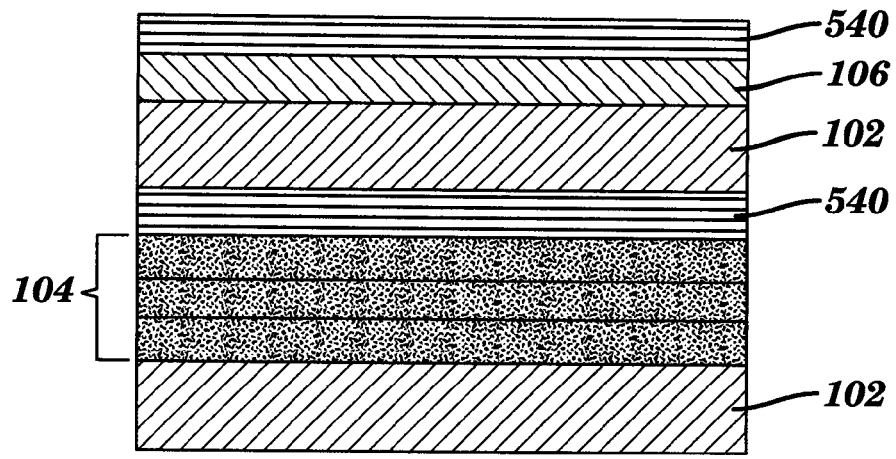
FIG. 5A depicts the material stack that comprises a second embodiment of the invention.

FIG. 5A depicts the material stack that comprises a second embodiment of the invention. In comparison, with the material stack of FIG. 4A, note that a protective layer 540 has been deposited between the insulator 104 and conductive layer 102.

Figure 5B:
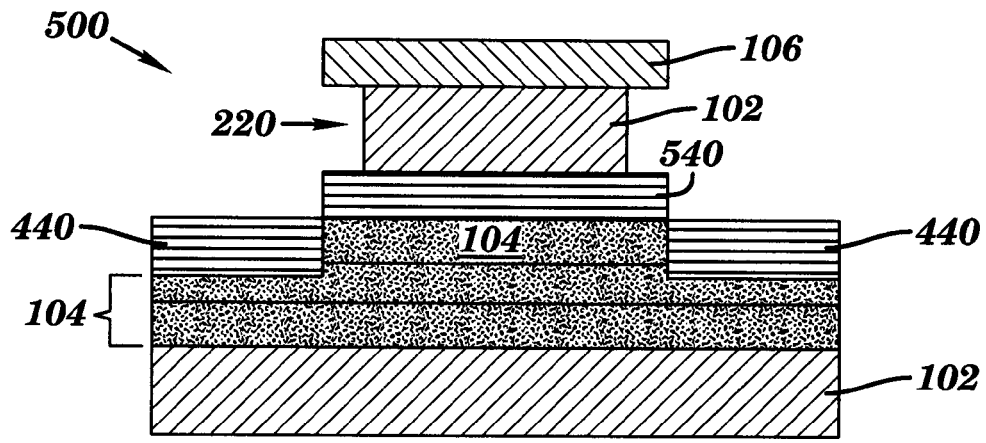
FIG. 5B depicts the second embodiment of the invention 500.

FIG. 5B depicts the second embodiment of the invention 500. The primary difference between the embodiment depicted in FIG. 4B and the embodiment depicted in FIG. 5b is the protective layer 540 deposited between the insulator 104 and conductive layer 102. While not required, the second embodiment may include a protective layer 440 deposited adjacent the insulator 104 as in the first embodiment of the invention 400.

Figure 5C:
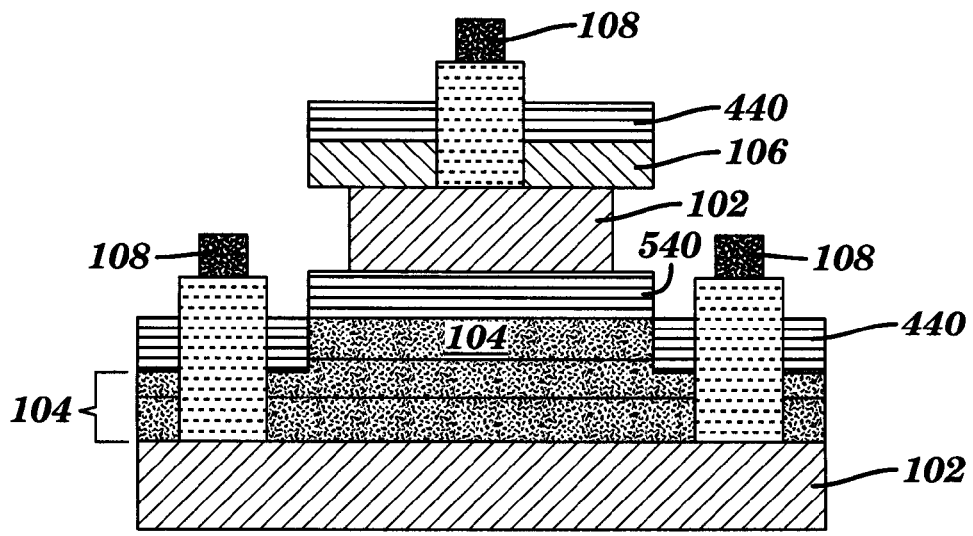
FIG. 5C depicts the second embodiment of the invention 500 with additional, optional features.

FIG. 5C depicts the second embodiment of the invention 500 with additional, optional features. Similar to FIG. 4C, FIG. 5C includes embedded contacts 108 and an additional protective layer 440 as deposited on the etch stop 106.

The invention solves the aforementioned problems associated with prior art MIM capacitors. More specifically, the invention reduces edge defects associated with MIM capacitors through the use of a pullback chemistry, while the invention simultaneously prevents yield failures associated with high-K dielectric through the use of a protective layer 440. The invention is dielectric independent. Therefore, both high and low-K dielectric materials can be used as insulator 104 without affecting yield.

While the invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the invention.

What is claimed is:

1. A capacitor, comprising:
   a first conductive layer;
   an insulator having a first top surface, said first top surface having a first length, and also having a second top surface, wherein said first top surface is higher than said second top surface, said first and second top surfaces being directly on top of said first conductive layer;
   a first protective layer having said first length and having an interface on said first top surface, wherein said first protective layer comprises SiC; and
   a second conductive layer having a second length directly contacting said first protective layer, said second length being shorter than said first length.

2. A capacitor as in claim 1 further comprising:
   a second protective layer adjacent said interface and on said second top surface.

3. A capacitor as in claim 1, further comprising:
   an etch stop on said second conductive layer.

4. A capacitor as in claim 3, further comprising:
   a third protective layer on said etch stop.

5. A capacitor as in claim 1, said insulator comprises a plurality of layers.

6. A capacitor as in claim 1, said first conductive layer comprises at least one of TiN, Ta, TaN, W, Al, and Cu.

7. A capacitor as in claim 1, said second conductive layer comprises at least one of TiN, Ta, TaN, W, Al, and Cu.

8. A capacitor as in claim 1, said insulator comprises at least one of $Al_2O_3$, SiN, $HfO_2$, $ZrO_2$, $SiO_xN_y$, $HfSiO_x$, $SiO_2$, $SrTiO_3$, $La_2O_3$, and $Y_2O_3$.

9. A capacitor as in claim 3, said etch stop comprises one of $SiO_2$ and SiCOH.

10. A capacitor as in claim 1, said first length is a value between 10 μm and 1000 μm, while said second length is 1 μm-5 μm less than said value.

* * * * *